United States Patent
Yoshizuka et al.

(10) Patent No.: US 8,926,258 B2
(45) Date of Patent: Jan. 6, 2015

(54) SUBSTRATE SUPPORTING APPARATUS AND SUBSTRATE TRANSPORTING APPARATUS WITH COUPLING MAGNETS

(71) Applicant: Canon Anelva Corporation, Kawasaki-shi (JP)

(72) Inventors: Koichi Yoshizuka, Hachioji (JP); Satoshi Yamada, Kawasaki (JP)

(73) Assignee: Canon Anelva Corporation, Kawasaki-shi (JP)

( * ) Notice: Subject to any disclaimer, the term of this patent is extended or adjusted under 35 U.S.C. 154(b) by 178 days.

(21) Appl. No.: 13/664,769

(22) Filed: Oct. 31, 2012

(65) Prior Publication Data

US 2013/0164108 A1  Jun. 27, 2013

(30) Foreign Application Priority Data

Dec. 21, 2011 (JP) .................................. 2011-279259

(51) Int. Cl.
*B25J 15/00* (2006.01)
*B25J 17/02* (2006.01)
*C23C 14/50* (2006.01)

(52) U.S. Cl.
CPC .......... *B25J 15/0047* (2013.01); *B25J 15/0019* (2013.01); *B25J 17/0233* (2013.01); *C23C 14/505* (2013.01); *Y10S 901/28* (2013.01)
USPC ........................ 414/744.2; 248/206.5; 901/28

(58) Field of Classification Search
CPC .. B25J 9/1015; B25J 15/0014; B25J 15/0019; B25J 15/0047; B25J 17/02; B25J 17/0233; C23C 14/50; C23C 14/505
USPC ........................ 414/744.2; 248/206.5; 901/28
See application file for complete search history.

(56) References Cited

U.S. PATENT DOCUMENTS

| 5,782,445 A * | 7/1998 | Cleek ......................... 248/206.5 |
| 2009/0189034 A1 * | 7/2009 | Bresolin ..................... 248/206.5 |
| 2010/0300875 A1 * | 12/2010 | Chen et al. ................ 204/298.02 |
| 2011/0287177 A1 * | 11/2011 | Yamada et al. ................ 427/127 |

FOREIGN PATENT DOCUMENTS

| JP | 2001-089851 A | 4/2001 | |
| JP | 2001089851 A * | 4/2001 | .............. C23C 14/50 |

* cited by examiner

*Primary Examiner* — Gerald McClain
(74) *Attorney, Agent, or Firm* — Fitzpatrick, Cella, Harper & Scinto

(57) ABSTRACT

A substrate supporting apparatus includes a substrate support that supports a substrate. A first connecting member is connected to the substrate support and includes a first magnet. A second connecting member faces the first connecting member and is connectable to a transport robot for transporting the substrate to a substrate holder. The second connecting member includes a second magnet magnetically coupled with the first magnet. A spacer is configured to hold an interval between the first connecting member and the second connecting member. The first connecting member and the second connecting member are relatively movable in a plane direction of the substrate via the spacer.

8 Claims, 8 Drawing Sheets

SUBSTRATE SUPPORTING APPARATUS AND SUBSTRATE TRANSPORTING APPARATUS WITH COUPLING MAGNETS

BACKGROUND OF THE INVENTION

1. Field of the Invention

The present invention relates to a substrate supporting apparatus for supporting, for example, a substrate for a hard disk (magnetic storage medium) and a substrate transporting apparatus.

2. Description of the Related Art

Conventionally, to transport a substrate (for example, hard disk substrate) having a hole at the center while keeping it in the vertical orientation, a substrate supporting apparatus having a V-shaped groove is inserted into the hole to support the substrate, and a transport robot transports the substrate together with the substrate supporting apparatus. However, when the substrate supported in the vertical orientation is attached to an attachment hole provided in a substrate holder, the transport robot may excessively press the substrate against the fixed pawls of the attachment hole, and the fixed pawls may damage the outer peripheral portion of the substrate.

To solve this problem, Japanese Patent Laid-Open No. 2001-89851 proposes a substrate supporting apparatus that supports a substrate by interposing a buffer mechanism in the substrate support.

The buffer mechanism needs to be more flexible along with the recent diversification of the substrate materials and sizes. More specifically, if a substrate is made of a material softer than that of a fixed pawl, a more elastic buffer mechanism is necessary for attaching the substrate to the substrate holder without damaging the outer peripheral portion of the substrate. In addition, as the substrate size becomes small, the substrate mass decreases. The buffer mechanism for substrate attachment needs to have a flexibility, that is, a higher elasticity suitable for the substrate mass.

SUMMARY OF THE INVENTION

The present invention has been made in consideration of the aforementioned problems, and realizes a substrate supporting apparatus capable of improving the buffer effect and a substrate transporting apparatus using the same.

In order to solve the aforementioned problems, the present invention provides a substrate supporting apparatus comprising: a substrate support that supports a substrate. A first connecting member connected to the substrate support and includes a first magnet. A second connecting member faces the first connecting member and is connectable to a transport robot for transporting the substrate to a substrate holder. The second connecting member includes a second magnet magnetically coupled with the first magnet. A spacer is configured to hold an interval between the first connecting member and the second connecting member, and the first connecting member and the second connecting member are relatively movable in a plane direction of the substrate via the spacer.

In order to solve the aforementioned problems, the present invention provides a substrate transporting apparatus comprising: a substrate supporting apparatus defined above; and a transport robot that is connected to the substrate supporting apparatus and transports a substrate to a substrate holder.

According to the present invention, it is possible to reduce the external force applied to a substrate when attaching it to a substrate holder, and even when attaching a substrate made of a material softer than that of a fixed pawl, properly prevent damage or breakage of the outer periphery of the substrate.

In addition, according to the present invention, a spacer is provided between magnets, thereby making the buffer function act in both the plane direction and the circumferential direction of a substrate.

Furthermore, according to the present invention, when the substrate is detached from the substrate holder, and the load applied to the substrate support of the substrate supporting apparatus is removed, centering is automatically performed without changing the neutral position.

Further features of the present invention will become apparent from the following description of exemplary embodiments (with reference to the attached drawings).

DESCRIPTION OF THE EMBODIMENTS

Figure 1:
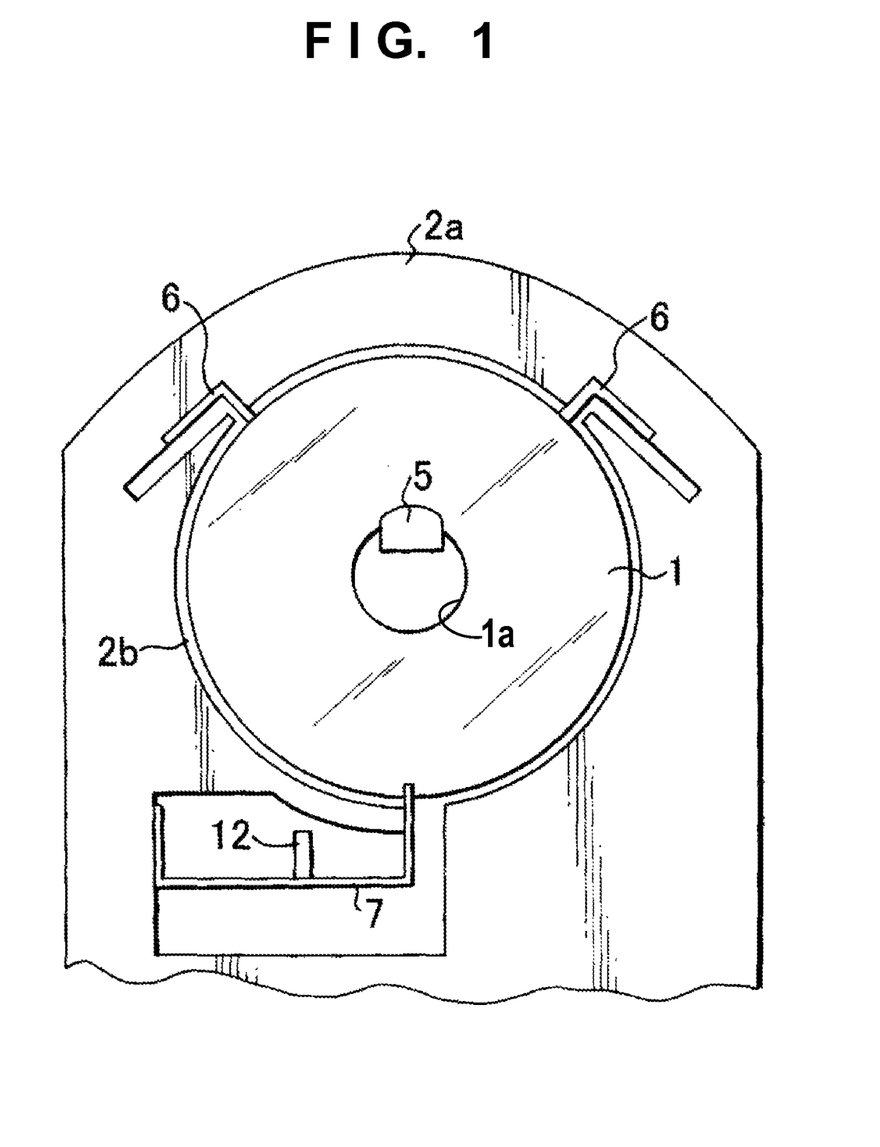
FIG. 1 is a front view showing the configuration of a substrate holder according to an embodiment of the present invention.
Figure 2A:
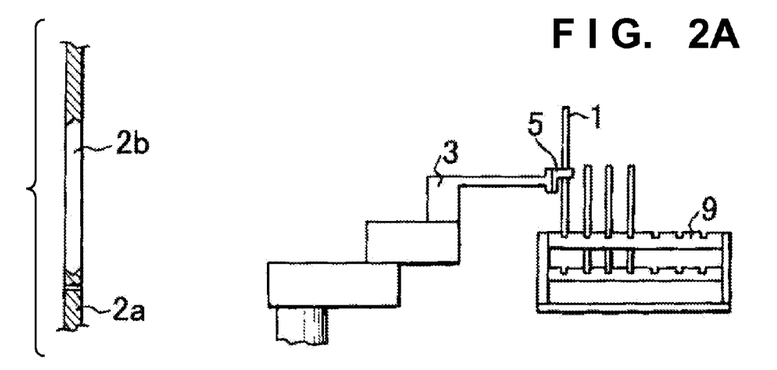
FIGS. 2A to 2C are views for explaining a step from extraction of a substrate from a substrate cassette to attachment to the substrate holder by a substrate transporting apparatus according to an embodiment of the present invention.
Figure 2B:
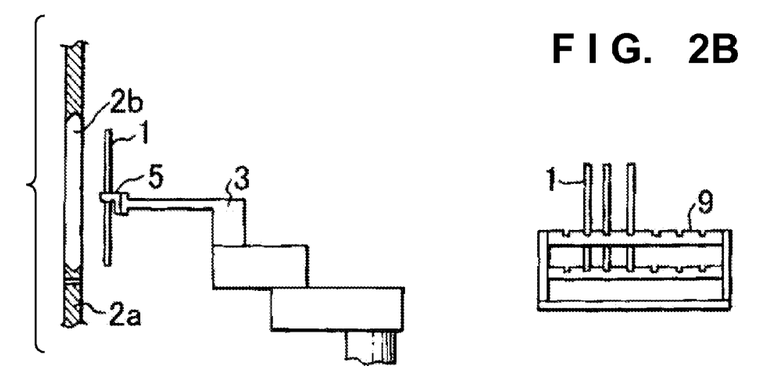
Figure 2C:
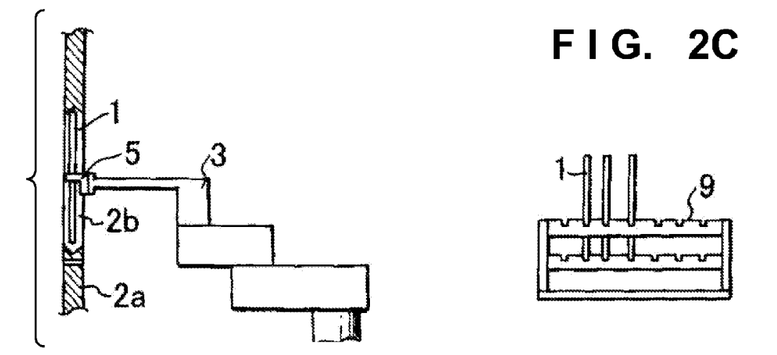

A mode for carrying out the present invention will now be described in detail with reference to the accompanying drawings. FIG. 1 is a front view showing the configuration of a substrate holder for holding a substrate. FIGS. 2A to 2C are views for explaining a process from a step of carrying out a substrate from a substrate cassette to a step of attaching it to the substrate holder by a substrate transporting apparatus according to an embodiment of the present invention. As shown in FIG. 1, a substrate holder 2a includes a substrate attachment hole 2b used to attach a substrate 1, and two fixed pawls 6 used to support the substrate 1 in the substrate attachment hole 2b. The substrate holder 2a also includes a movable pawl 7 used to attach the substrate 1 to the substrate attachment hole 2b or detach the substrate from the attachment hole 2b, and a movable pawl driving mechanism (to be referred to as a driving mechanism hereinafter) 12 for driving the movable pawl 7.

The substrate 1 is, for example, a disk-shaped hard disk substrate having a hole 1a at the center, as shown in FIG. 1. As shown in FIG. 2A, a substrate support 5 having a V-shaped groove is inserted into the hole 1a of the substrate 1 by the operation of a substrate transporting apparatus (to be referred to as a transport robot hereinafter) 3. The substrate 1 is transported while being supported in the vertical orientation by the substrate support 5. In this embodiment, a hard disk substrate is exemplified. However, the present invention is not limited to this and is applicable to support and transport any substrate supported at the hole by the substrate support 5. In this example, the hole 1a provided in the substrate 1 is a circular hole provided at the center of the substrate 1. However, the position of the hole 1a is not limited to the center. In addition, the hole may have a rectangular or square shape other than the circular shape. In this example, the substrate support 5 having a V-shaped groove is used. However, the present invention is not limited to this, and may include a grip mechanism that sandwiches and supports the substrate 1. Additionally, the substrate support 5 need not always support the substrate 1 in the vertical orientation and may support it in the horizontal direction.

The step of causing the transport robot 3 to attach the substrate 1 to the substrate holder 2a will be described next with reference to FIGS. 1 and 2A to 2C. FIG. 2A illustrates a state in which the substrate transport robot 3 extracts the substrate 1 in the vertical orientation from a substrate cassette 9. FIG. 2B illustrates a state in which the transport robot 3 turns to move the substrate 1 to the side of the substrate holder 2a. FIG. 2C illustrates a state in which the substrate 1 is transferred to the substrate attachment hole 2b of the substrate holder 2a.

First, as shown in FIG. 2A, the transport robot 3 inserts the substrate support 5 provided at the distal end into the hole 1a of the substrate 1 stored in the substrate cassette 9, thereby supporting the substrate 1. While keeping the substrate 1 supported, the transport robot 3 turns toward the substrate holder 2a to move the substrate 1, as shown in FIG. 2B. At this time, the movable pawl 7 of the substrate holder 2a shown in FIG. 1 is kept pressed down by the driving mechanism 12.

Next, as shown in FIG. 2C, the transport robot 3 moves the substrate 1 toward the substrate holder 2a and inserts the substrate 1 into the substrate attachment hole 2b. The transport robot 3 presses the substrate 1 against the fixed pawls 6 on the upper side of the substrate attachment hole 2b. Finally, the pressing of the movable pawl 7 down by the driving mechanism 12 is canceled. The movable pawl 7 is pressed up, and the substrate 1 is supported by the fixed pawls 6 and the movable pawl 7, thus completing attachment of the substrate 1. Note that FIGS. 2A to 2C are views for explaining the substrate transport step, and details of the structure are not illustrated.

First Embodiment

Figure 3:
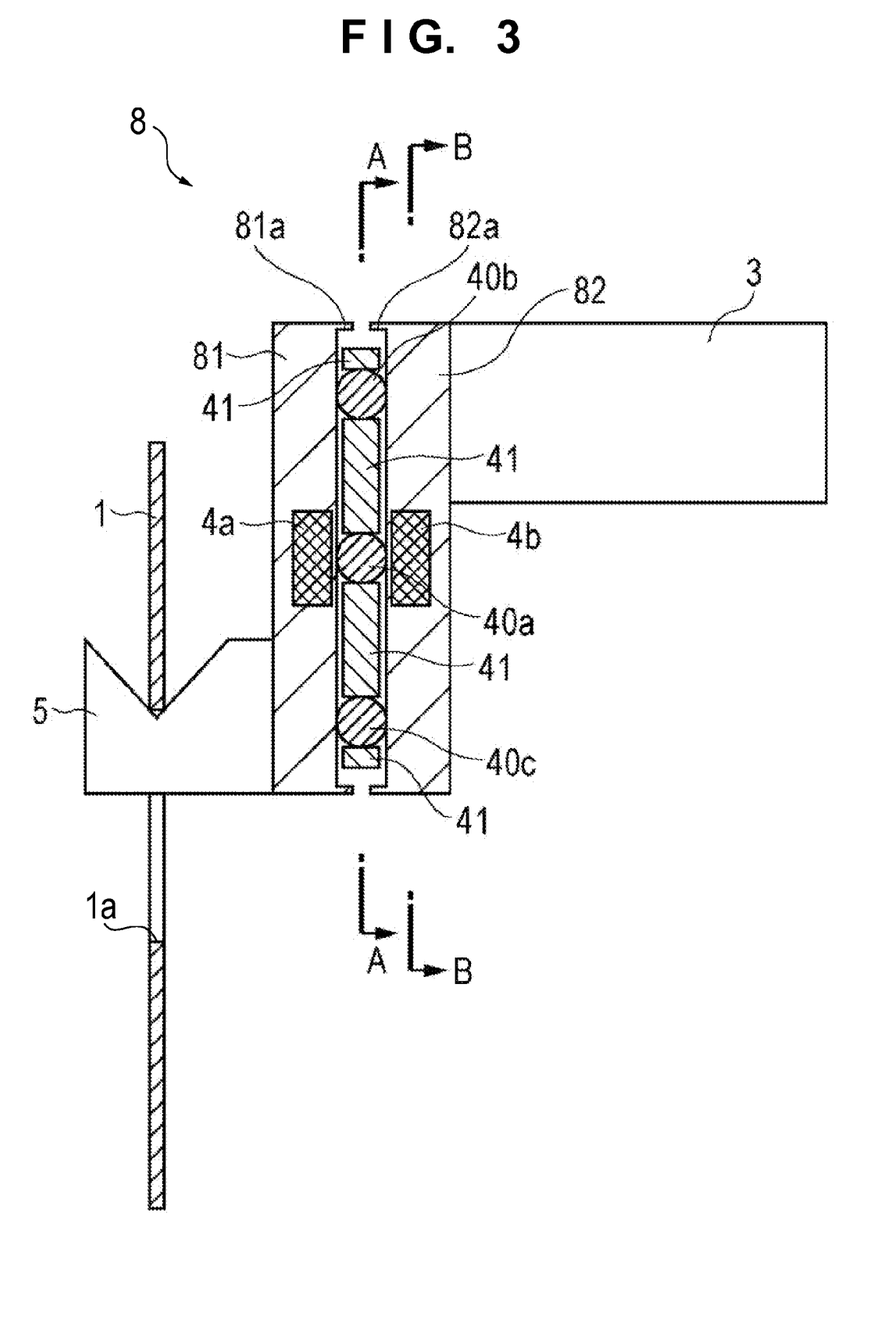
FIG. 3 is a side sectional view showing a substrate supporting apparatus according to the first embodiment of the present invention.
Figure 4:
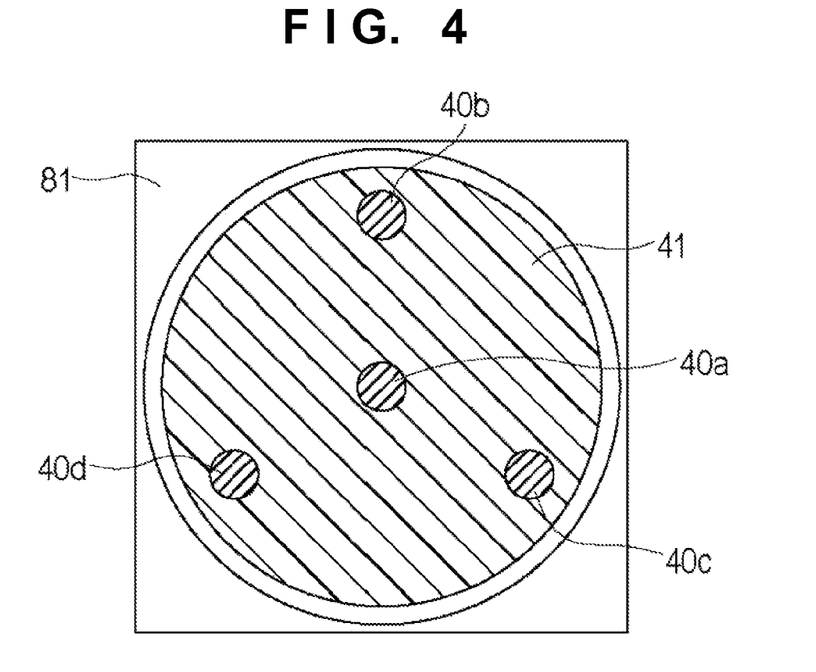
FIG. 4 is a sectional view taken along a line A-A in FIG. 3.
Figure 5:
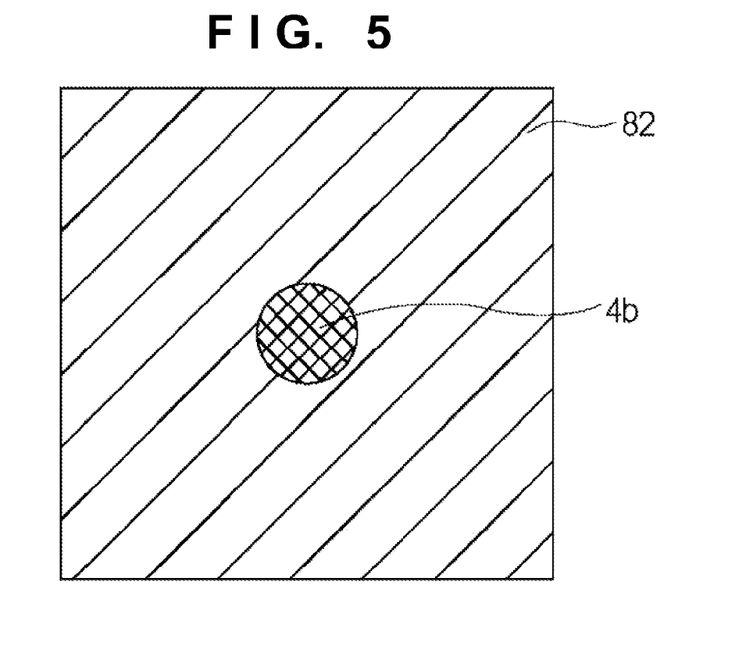
FIG. 5 is a sectional view taken along a line B-B in FIG. 3.
Figure 6:
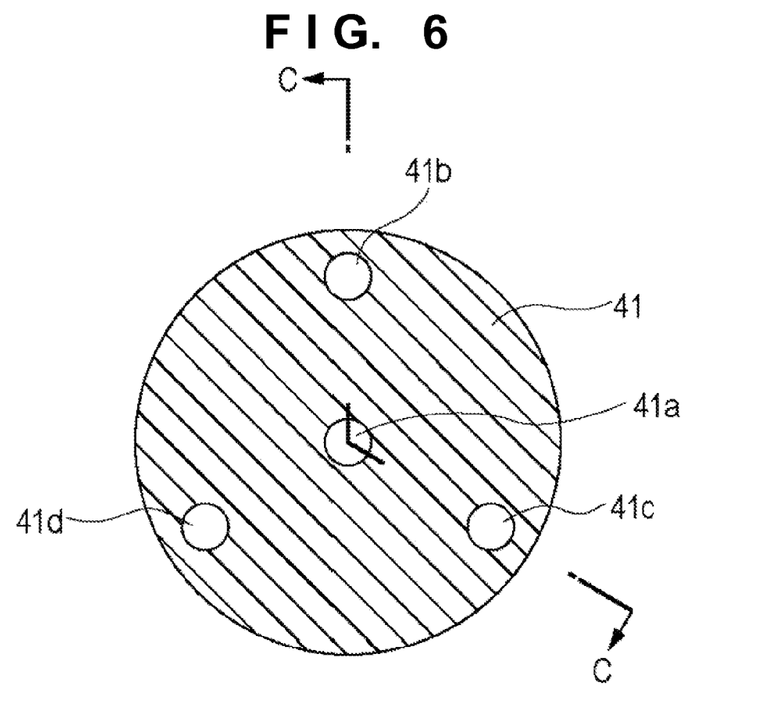
FIG. 6 is a plan view showing a retainer 41 according to the first embodiment of the present invention.
Figure 7:
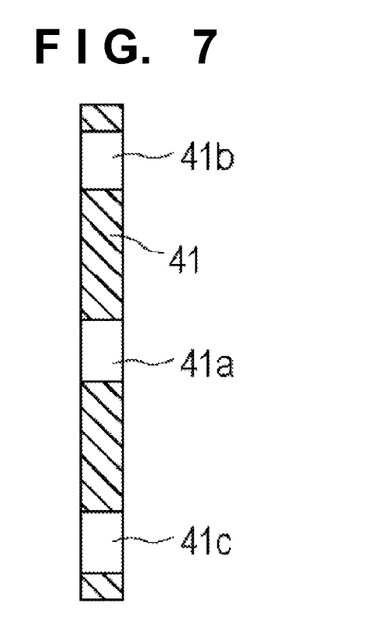
FIG. 7 is a sectional view taken along a line C-C in FIG. 6.

A substrate supporting apparatus according to the first embodiment of the present invention will be described with reference to FIGS. 3 to 6. FIG. 3 is a side sectional view showing the substrate supporting apparatus according to the first embodiment of the present invention. FIG. 4 is a sectional view taken along a line A-A in FIG. 3. FIG. 5 is a sectional view taken along a line B-B in FIG. 3. FIG. 6 is a plan view showing a retainer 41. FIG. 7 is a sectional view taken along a line C-C in FIG. 6. The same reference numerals as in FIG. 1 or 2 denote the same parts in FIG. 3. The substrate supporting apparatus according to this embodiment includes a buffer mechanism formed from magnets and spacers and used to prevent a substrate 1 from being damaged when a transport robot 3 presses the substrate 1 against fixed pawls 6 to attach the substrate 1 to a substrate holder 2a. This buffer mechanism is an improvement of the buffer mechanism described in Japanese Patent Laid-Open No. 2001-89851. The buffer mechanism reduces an external force applied to the substrate 1 and properly prevents damage or breakage of the substrate 1 when attaching it to the substrate holder 2a.

As shown in FIG. 3, a substrate supporting apparatus 8 includes a first connecting member 81 fixed to a substrate support 5 having a V-shaped groove, and a second connecting member 82 arranged at a predetermined interval while facing the first connecting member 81. The second connecting member 82 is configured to be connectable to the distal end of the arm of the transport robot 3. A disk-shaped magnet 4a, provided at the center of the first connecting member 81, and a disk-shaped magnet 4b, provided at the center of the second connecting member 82 and having a magnetic pole different from that of the magnet 4a, are magnetically coupled with each other. As shown in FIGS. 3 and 4, a spacer 40a that is a roller is arranged between the magnet 4a of the first connecting member 81 and the magnet 4b of the second connecting member 82. The spacer is configured to allow movement of the first connecting member 81 and the second connecting member 82 relative to each other. In addition, as shown in FIGS. 3 and 4, three spacers 40b, 40c, and 40d are arranged around the spacer 40a between the first connecting member 81 and the second connecting member 82 at an interval of 120° on a circumference about the spacer 40a. In this embodiment, these spacers are iron balls. However, the present invention is not limited to this, and any material other than a magnetic metal such as iron, for example ceramic, may be used. In addition, each spacer preferably has a spherical shape to relatively move the connecting members 81 and 82 in the plane direction of the substrate. Since these spacers are spheres of the same size, the connecting members 81 and 82 are held to be parallel to each other. Note that as for the positions of the spacers, providing them between the connecting members 81 and 82 suffices. However, to increase the magnetic coupling force between the first magnet of the connecting member 81 and the second magnet of the connecting member 82, a spacer made of a magnetic metal such as iron is preferably provided between the first magnet 4a and the second magnet 4b.

In addition, a disk-shaped retainer 41 for holding the positional relationship between the spacers 40a, 40b, 40c, and 40d is provided between the first connecting member 81 and the second connecting member 82, as shown in FIGS. 4, 6, and 7. As shown in FIG. 6, the retainer 41 has four through holes 41a, 41b, 41c, and 41d corresponding to the positions of the spacers 40a, 40b, 40c, and 40d. The disk-shaped retainer 41 is inserted into circular grooves formed in the inner surfaces of the connecting members 81 and 82 and held. The retainer is made of a nonmagnetic material, preferably, a material such as a resin from the viewpoint of weight reduction. Note that the retainer need not always have the circular shape and may have a square or rectangular shape. In this case, the grooves formed in the connecting members conform to the shape of the retainer.

As described above, in the substrate supporting apparatus 8 according to this embodiment, the connecting members 81 and 82 can be translated relative to each other in the vertical and horizontal directions by the spacers 40a, 40b, 40c, and 40d at a predetermined interval, and also magnetically coupled with each other by the magnets 4a and 4b, thereby maintaining the interval. That is, according to the present invention, providing the spherical spacers between the magnets 4a and 4b allows to relatively move the first connecting member 81 and the second connecting member 82 in the plane direction of the substrate while holding the connecting members at a predetermined interval.

In this embodiment, the three spacers 40b, 40c, and 40d are arranged at an interval of 120° (equal interval) on the circumference about the spacer 40a. However, the number of spacers is not limited to three, and at least two spacers suffice. For example, when two spacers are used, they are arranged at an interval of 180° on the circumference about the spacer 40a. When four spacers are used, they are arranged at an interval of 90° on the circumference about the spacer 40a.

Second Embodiment

Figure 8:
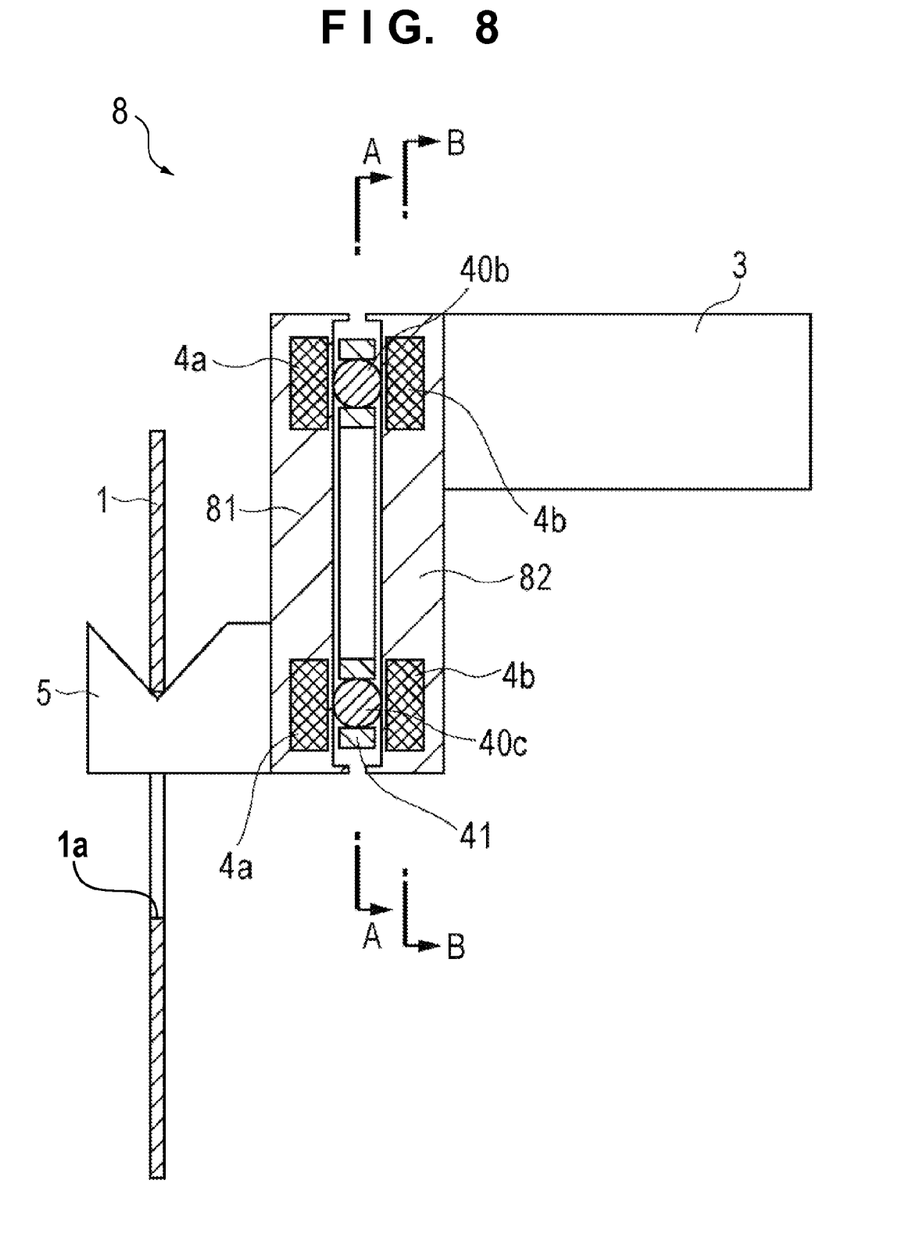
FIG. 8 is a side sectional view showing a substrate supporting apparatus according to the second embodiment of the present invention.
Figure 9:
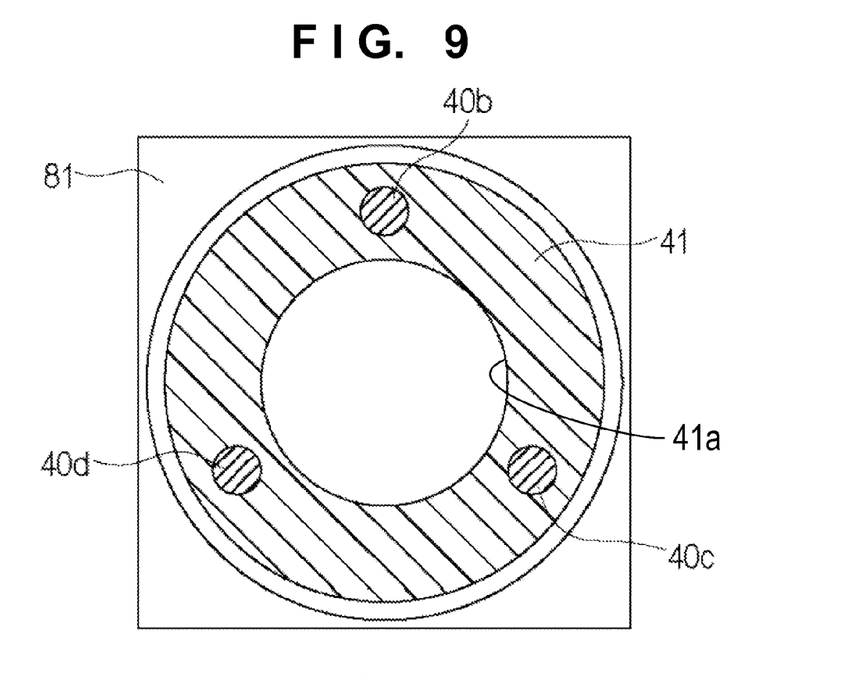
FIG. 9 is a sectional view taken along a line A-A in FIG. 8.
Figure 10:
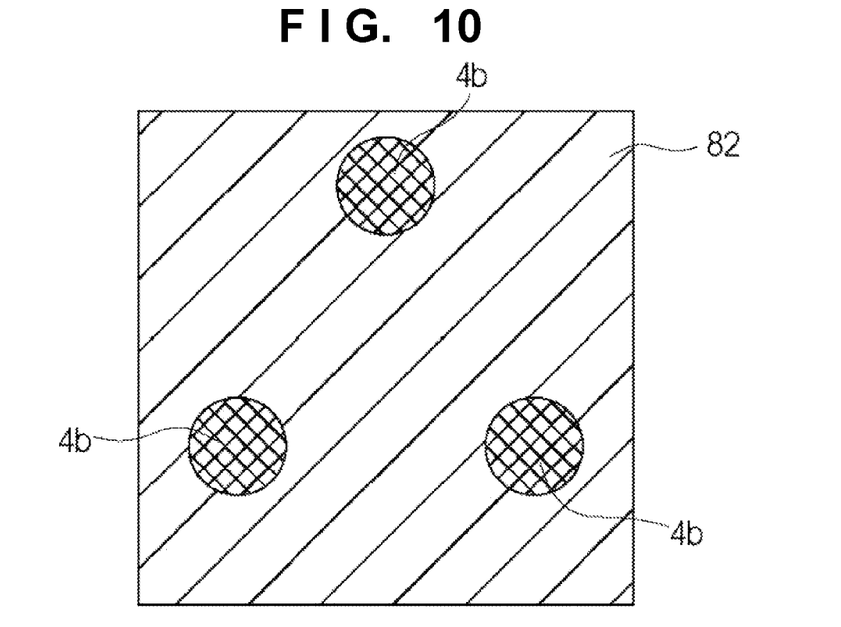
FIG. 10 is a sectional view taken along a line B-B in FIG. 8.
Figure 11:
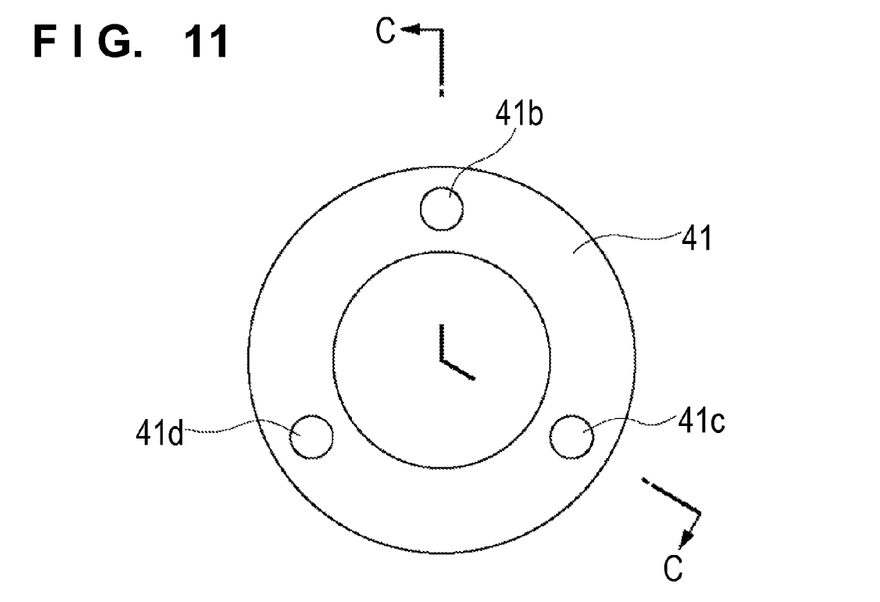
FIG. 11 is a plan view showing a retainer 41 according to the second embodiment of the present invention.
Figure 12:
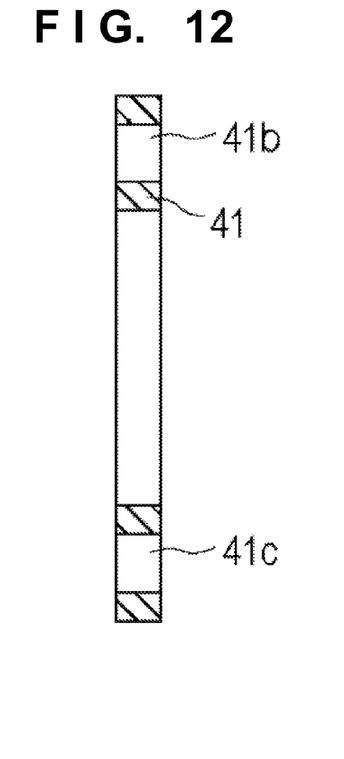
FIG. 12 is a sectional view taken along a line C-C in FIG. 11.

A substrate supporting apparatus according to the second embodiment of the present invention will be described next with reference to FIGS. 8 to 11. FIG. 8 is a side sectional view showing the substrate supporting apparatus according to the second embodiment of the present invention. FIG. 9 is a sectional view taken along a line A-A in FIG. 8. FIG. 10 is a sectional view taken along a line B-B in FIG. 8. FIG. 11 is a plan view of a retainer 41. FIG. 12 is a sectional view taken along a line C-C in FIG. 11. The substrate supporting apparatus shown in FIG. 8 basically has the same configuration as that of the substrate supporting apparatus shown in FIG. 3. The same reference numerals denote the same constituent members, and a detailed description thereof will be omitted.

A substrate supporting apparatus 8 according to the second embodiment includes neither the magnets 4a and 4b at the centers of connecting members 81 and 82 nor the spacer 40a between the magnets 4a and 4b, as shown in FIGS. 8, 9, and 10, unlike the substrate supporting apparatus according to the first embodiment shown in FIG. 3. Instead, disk-shaped magnets 4a and 4b are provided on the connecting members 81 and 82 at positions corresponding to spacers 40b, 40c, and 40d.

In addition, the disk-shaped retainer 41 for holding the positional relationship between the spacers 40b, 40c, and 40d is provided between the first connecting member 81 and the second connecting member 82, as shown in FIGS. 8, 9, 11, and 12. The retainer 41 has three through holes 41b, 41c, and 41d corresponding to the positions of the spacers 40b, 40c, and 40d. In this embodiment, a through hole 41a is formed at the center of the retainer from the viewpoint of weight reduction. The disk-shaped retainer 41 is inserted into circular grooves formed in the inner surfaces of the connecting members 81 and 82 and held. Note that the retainer need not always have the circular shape and may have a square or rectangular shape. In this case, the grooves formed in the connecting members conform to the shape of the retainer.

As described above, in the substrate supporting apparatus 8 according to this embodiment, the connecting members 81 and 82 can be translated and rotated relative to each other in the vertical and horizontal directions by the spacers 40b, 40c, and 40d at a predetermined interval, and also magnetically coupled with each other by the magnets 4a and 4b, thereby maintaining the interval. Additionally, in the present invention, when the substrate is detached from the substrate holder, and the load applied to the substrate support of the substrate supporting apparatus is removed, the connecting members 81 and 82 can automatically return to the initial positions by the magnetic coupling force between the magnets.

In this embodiment, the three spacers 40b, 40c, and 40d are arranged at an equal interval of 120° on the circumference. However, the number of spacers is not limited to three, and at least two spacers suffice. For example, when two spacers are used, they are arranged at an equal interval of 180° on the circumference. When four spacers are used, they are arranged at an equal interval of 90° on the circumference.

Figure 13:
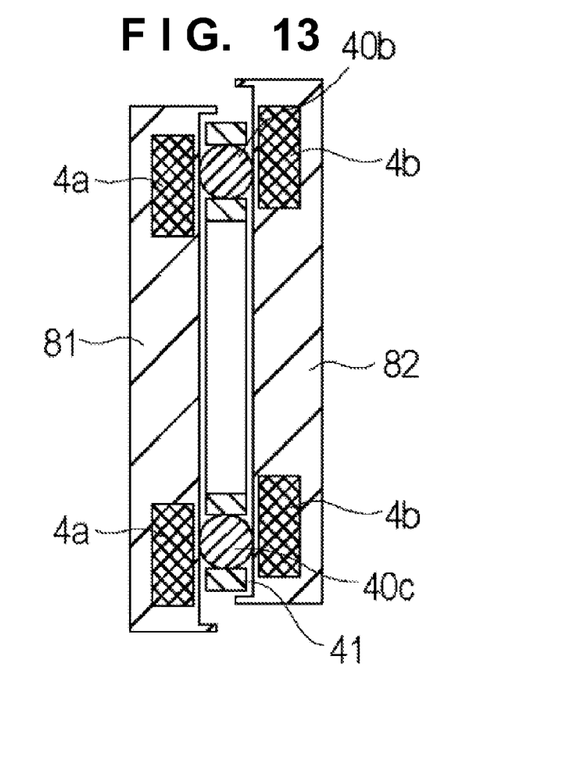
FIG. 13 is a view for explaining the buffer effect of the substrate supporting apparatus according to the embodiment of the present invention.

The buffer effect of the substrate supporting apparatus 8 according to this embodiment will be described with reference to FIG. 13. The rotatable spacer 40a is arranged between the first connecting member 81 and the second connecting member 82. Hence, the first connecting member 81 can smoothly move in the vertical, horizontal, and rotational directions relative to the second connecting member 82 connected to the substrate transport robot 3. When the first connecting member 81 has moved to a predetermined range, its movement relative to the second connecting member 82 is limited by the magnetic coupling force of the magnets 4a and 4b. In addition, when the external force to the first connecting member 81 or the second connecting member 82 is removed, the first connecting member 81 and the second connecting member 82 return to the initial positions due to the magnetic coupling force of the magnets 4a and 4b.

The preferred embodiments and examples of the present invention have been described above. However, the present invention is not limited to the embodiments and examples, and various changes and modifications can be made within the technical scope grasped from the scope of the claims.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-279259, filed Dec. 21, 2011, which is hereby incorporated by reference herein in its entirety.

What is claimed is:

1. A substrate supporting apparatus comprising:
   a substrate support that supports a substrate;
   a first connecting member connected to the substrate support, the first connecting member including a first magnet;
   a second connecting member facing the first connecting member and connectable to a transport robot for transporting the substrate to a substrate holder, the second connecting member including a second magnet magnetically coupled with the first magnet;
   a plurality of spacers configured to hold an interval between the first connecting member and the second connecting member; and
   a retainer configured to hold a positional relationship between the spacers and have through holes corresponding to the positions of the spacers,
   wherein the first connecting member and the second connecting member are relatively movable in a plane direction of the substrate via the spacers, and the retainer supports the spacers to be rotatable in the through holes while the positional relationship between the spacers is held when the first and second connecting members are relatively moved and returned to an initial position.

2. The apparatus according to claim 1, wherein the spacer is a sphere.

3. The apparatus according to claim 2, wherein
   the spacer includes at least three spacers.

4. The apparatus according to claim 1, wherein the spacer is provided between the first magnet and the second magnet.

5. The apparatus according to claim 4, wherein the spacer is made of a magnetic metal.

6. The apparatus according to claim 1, wherein the retainer is made of a nonmagnetic material.

7. A substrate transporting apparatus comprising:
a substrate supporting apparatus of claim 1; and
a transport robot that is connected to the substrate supporting apparatus and transports a substrate to a substrate holder.

8. The apparatus according to claim 7, wherein
the substrate holder has a substrate attachment hole to attach the substrate, the substrate attachment hole being provided with a fixed pawl for supporting the substrate, and a movable pawl for attaching or detaching the substrate, and
the transport robot inserts the substrate supported by a substrate support of the substrate supporting apparatus into the substrate attachment hole, presses the substrate against the fixed pawl, and, after the substrate has been pressed against the fixed pawl, presses the movable pawl against the substrate, thereby attaching the substrate to the substrate attachment hole of the substrate holder.

* * * * *